United States Patent
Song et al.

(10) Patent No.: US 9,252,228 B2
(45) Date of Patent: Feb. 2, 2016

(54) THRESHOLD VOLTAGE ADJUSTMENT IN METAL OXIDE SEMICONDUCTOR FIELD EFFECT TRANSISTOR WITH SILICON OXYNITRIDE POLYSILICON GATE STACK ON FULLY DEPLETED SILICON-ON-INSULATOR

(71) Applicant: QUALCOMM Incorporated, San Diego, CA (US)

(72) Inventors: Stanley Seungchul Song, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/093,105

(22) Filed: Nov. 29, 2013

(65) Prior Publication Data
US 2015/0155364 A1  Jun. 4, 2015

(51) Int. Cl.
*H01L 21/70* (2006.01)
*H01L 29/49* (2006.01)
*H01L 29/786* (2006.01)
*H01L 29/51* (2006.01)
*H01L 29/66* (2006.01)
*H01L 29/78* (2006.01)

(52) U.S. Cl.
CPC ........ *H01L 29/4916* (2013.01); *H01L 29/4908* (2013.01); *H01L 29/518* (2013.01); *H01L 29/66477* (2013.01); *H01L 29/78* (2013.01); *H01L 29/78603* (2013.01); *H01L 29/78648* (2013.01); *H01L 29/78696* (2013.01)

(58) Field of Classification Search
CPC ..................... H01L 21/02038; H01L 29/7812; H01L 2027/11857
USPC .......................................................... 257/347
See application file for complete search history.

(56) References Cited

U.S. PATENT DOCUMENTS

| 6,222,234 | B1 * | 4/2001 | Imai ................... H01L 27/1203 257/347 |
| 6,890,827 | B1 | 5/2005 | Choi et al. |
| 7,902,014 | B2 * | 3/2011 | Doyle ............. H01L 21/823807 438/197 |
| 7,955,940 | B2 | 6/2011 | Dyer et al. |
| 2003/0178622 | A1 | 9/2003 | Wei et al. |
| 2004/0079997 | A1 | 4/2004 | Miura |

(Continued)

OTHER PUBLICATIONS

International Search Report and Written Opinion—PCT/US2014/067750—ISA/EPO—Feb. 20, 2015 (132362WO).

(Continued)

*Primary Examiner* — Bilkis Jahan
(74) *Attorney, Agent, or Firm* — Muncy, Geissler, Olds & Lowe, P.C.

(57) ABSTRACT

A fully depleted silicon-on-insulator MOSFET transistor with reduced variation in threshold voltage. The substrate of the transistor is doped to form a ground plane below a buried oxide layer. A lightly doped channel is formed over the buried oxide layer. A gate dielectric of Silicon Oxynitride is formed over the channel, and a polysilicon gate is formed over the gate dielectric. The polysilicon gate is doped to have a work function not greater 4.2 electron volts for a p-type doped channel (for an n-channel MOSFET), and not less than 5.0 electron volts for an n-type doped channel (for a p-channel MOSFET). The thickness of the buried oxide layer and the channel need not be greater than 20 nanometers and 10 nanometers, respectively.

13 Claims, 3 Drawing Sheets

(56) References Cited

U.S. PATENT DOCUMENTS

| | | | |
|---|---|---|---|
| 2004/0155281 A1* | 8/2004 | Osada | G11C 11/412 257/315 |
| 2004/0262693 A1* | 12/2004 | Ohsawa | G01L 27/1203 257/369 |
| 2006/0027877 A1 | 2/2006 | Inaba | |
| 2006/0113605 A1* | 6/2006 | Currie | 257/368 |
| 2009/0181630 A1* | 7/2009 | Seshita et al. | 455/191.3 |
| 2009/0250755 A1 | 10/2009 | Ohmi et al. | |
| 2010/0025776 A1* | 2/2010 | Horstmann | H01L 21/28035 257/392 |
| 2011/0227159 A1* | 9/2011 | Chan | H01L 21/7624 257/351 |
| 2013/0140634 A1 | 6/2013 | Chan et al. | |
| 2014/0077864 A1* | 3/2014 | Bianchi | 327/512 |

OTHER PUBLICATIONS

Skotnicki T., "Polysilicon gate with depletion-or-metallic gate with buried channel: what evil worse?" Electron Devices Meeting, 1999, IEDM Technical Digest, International Washington, DC, USA Dec. 5-8, 1999, Piscataway, NJ, USA, IEEE, US, Dec. 5, 1999, pp. 661-664, XP032399342, DOI: 10.11091 IEDM.1999.824239 ISBN: 978-0-7803-5410-4 p. 662, col. 1, paragraph 2.

* cited by examiner

THRESHOLD VOLTAGE ADJUSTMENT IN METAL OXIDE SEMICONDUCTOR FIELD EFFECT TRANSISTOR WITH SILICON OXYNITRIDE POLYSILICON GATE STACK ON FULLY DEPLETED SILICON-ON-INSULATOR

FIELD OF DISCLOSURE

Embodiments pertain to transistors, and more particularly, to fully depleted silicon-on-insulator transistors.

BACKGROUND

FDSOI (Fully Depleted Silicon-On-Insulator) transistors are of interest because of the possibility in achieving small transistor gate lengths with low OFF-state current. The gate dielectric thickness and the relevant body dimensions determine the short channel characteristics of FDSOI transistors, which may comprise an ultra thin body with low or no channel doping.

SiON (Silicon Oxynitride) is a candidate for a gate dielectric in a FDSOI transistor. SiON is a ceramic material composed of the system $SiO_xN_y$. Examples of SiON when in an amorphous form are $SiO_2$ (Silica) and $Si_3N_4$ (Silicon Nitride). SiON can be grown on silicon and used as a gate dielectric layer.

FDSOI transistors having a SiON polysilicon gate structure have not been widely used due to the difficulty in obtaining an appropriate threshold voltage for conventional logic operation. In practice, the substrate of an FDSOI transistor should have very low doping in order to achieve little variation in the threshold voltage while maintaining a high carrier mobility, key advantages of FDSOI transistors. The polysilicon gate should be highly doped in order to eliminate polysilicon depletion effects.

However, with a combination of high polysilicon doping with low body doping, an FDSOI transistor with a SiON Polysilicon gate structure has a very low threshold voltage. Furthermore, when the gate length scales to sub-100 nm technology, the threshold voltage may drop to a negative value (for the N+ polysilicon case). Previous techniques to increase the threshold voltage to an appropriate value involve either an increase in substrate doping, thereby compromising the benefit of using an FDSOI transistor, or a decrease in polysilicon doping, thereby increasing the polysilicon depletion effect, leading to an increase in the channel inversion thickness.

SUMMARY

Embodiments of the invention are directed to systems and methods for adjusting the threshold voltage in an MOSFET (Metal Oxide Semiconductor Field Effect Transistor) with a SiON (Silicon Oxynitride) polysilicon gate stack on an FDSOI (Fully Depleted Silicon-On-Insulator).

In an embodiment, an apparatus includes a silicon substrate; a doped ground plane formed in the silicon substrate; a buried oxide layer formed in the silicon substrate; a silicon channel formed on the buried oxide layer, the silicon channel doped p-type; a first source/drain region formed in the silicon channel; a second source/drain region formed in the silicon channel; a dielectric formed on the silicon channel; and a polysilicon gate formed on the dielectric, wherein the polysilicon gate has a work function not greater than 4.2 eV.

In another embodiment, an apparatus includes a silicon substrate; a doped ground plane formed in the silicon substrate; a buried oxide layer formed in the silicon substrate; a silicon channel formed on the buried oxide layer, the silicon channel doped n-type; a first source/drain region formed in the silicon channel; a second source/drain region formed in the silicon channel; a dielectric formed on the silicon channel; and a polysilicon gate formed on the dielectric, wherein the polysilicon gate has a work function not less than 5.0 eV.

In another embodiment, a method includes doping a silicon substrate to form a ground plane having a doping concentration not less than $5 \times 10^{18}$ cm$^{-3}$; forming a buried oxide layer in the silicon substrate, the buried oxide layer having a thickness not greater than 20 nm; forming a p-type doped silicon channel on the buried oxide layer having a thickness not greater than 10 nm; forming a dielectric on the silicon channel; and forming a polysilicon gate on the dielectric with a work function not greater than 4.2 eV.

In another embodiment, a method includes doping a silicon substrate to form a ground plane having a doping concentration not less than $5 \times 10^{18}$ cm$^{-3}$; forming a buried oxide layer in the silicon substrate, the buried oxide layer having a thickness not greater than 20 nm; forming an n-type doped silicon channel on the buried oxide layer having a thickness not greater than 10 nm; forming a dielectric on the silicon channel; and forming a polysilicon gate on the dielectric with a work function not less than 5.0 eV.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that specific circuits (e.g., application specific integrated circuits (ASICs)), one or more processors executing program instructions, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In an embodiment, a silicon substrate of an FDSOI transistor is doped to form a ground plane, and both a buried oxide layer and a silicon channel thickness are scaled. With a doping concentration for the ground plane not less than $5 \times 10^{18}$ cm$^{-3}$, and with the silicon channel and buried oxide layer not greater than 10 nm and 20 nm, respectively, it is expected for an embodiment that the threshold voltage for the resulting MOSFET is at about 0.17 V. This acceptable threshold voltage is achieved without appreciably lowering the work function of the polysilicon gate or appreciably doping the silicon channel. In this way, the variation in threshold voltage is kept low.

Figure 1:
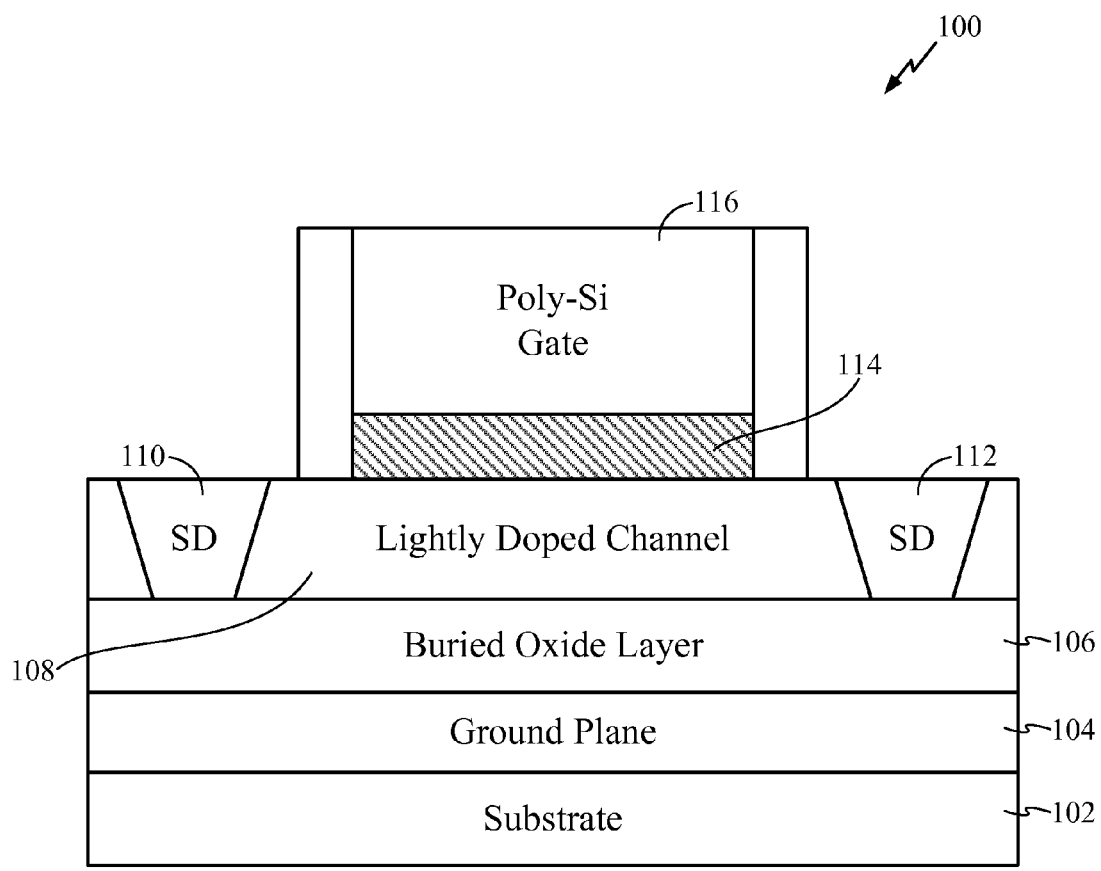
FIG. 1 is a simplified cross-sectional view of a transistor according to an embodiment.

FIG. 1 is a cross-sectional view of an FDSOI transistor 100 according to an embodiment. A silicon substrate 102 is processed as follows. Doping is performed to provide the ground plane 104, where for some embodiments the doping concentration for the ground plane 104 is not less than $5 \times 10^{18}$ cm$^{-3}$. Above the ground plane 104 is formed a buried oxide layer (BOX) 106, which for some embodiments may not exceed 20 nm in thickness. The silicon channel 108 is above the BOX 106, which for some embodiments is not greater than 10 nm in thickness. The silicon channel 108 is lightly doped, where the doping concentration is not greater than $5 \times 10^{17}$ cm$^{-3}$ for some embodiments.

Illustrated in FIG. 1 are the source/drain regions (diffusions), labeled 110 and 112. Above the silicon channel 108 is formed a dielectric layer 114. For some embodiments, the dielectric layer 114 has a thickness of about 1.5 nm to 2.5 nm, and may comprise silicon dioxide, nitride silicon oxide, or silicon nitride, for example. A polysilicon gate 116 is formed above the dielectric layer 114. The polysilicon gate 116 is highly N+ doped, and for some embodiments, the polysilicon gate 116 is doped to have a work function not greater than 4.2 eV for the case when the channel 108 is doped p-type (to form an n-channel MOSFET), and not lower than 5.0 eV for the case when the channel 108 is doped n-type (to form a p-channel MOSFET).

Figure 2:
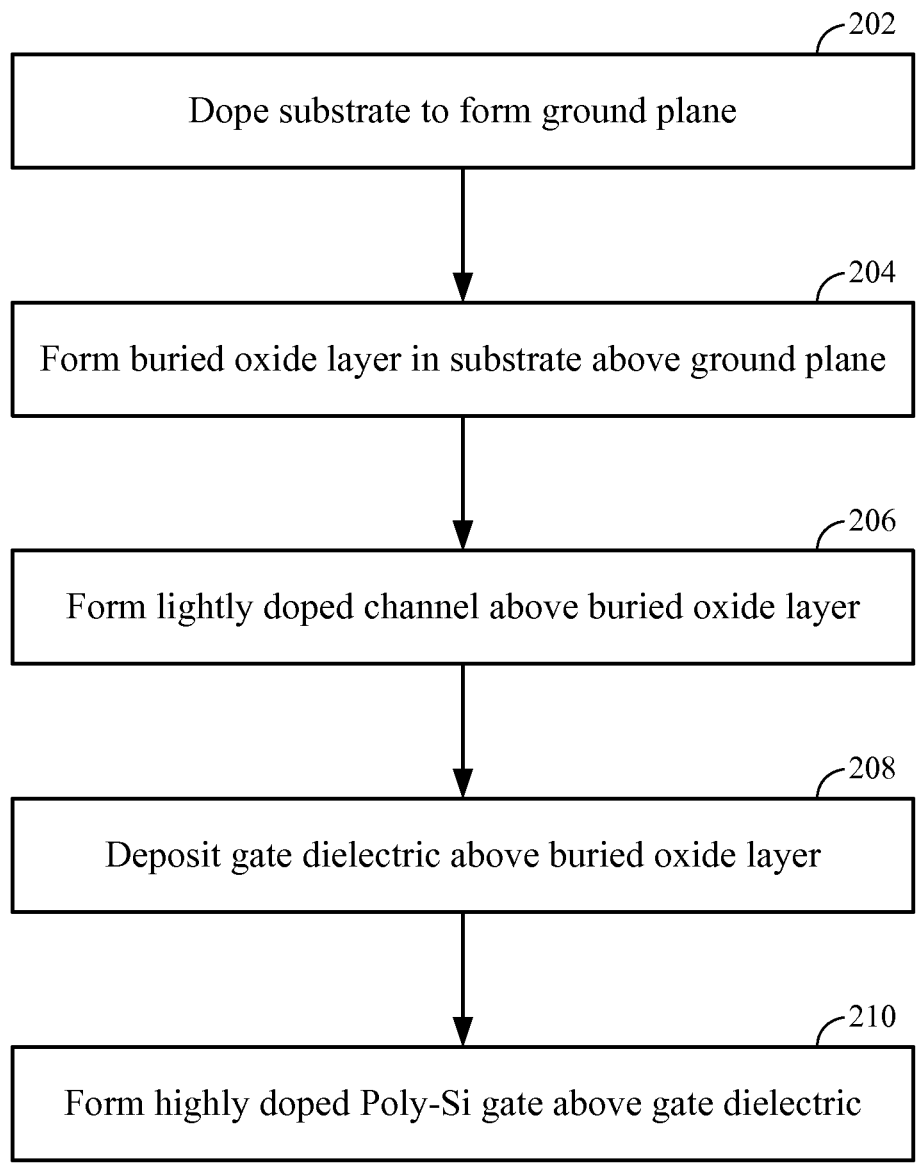
FIG. 2 Illustrates a process flow according to an embodiment.

FIG. 2 illustrates a process flow according to an embodiment. In step 202 the substrate is doped to form a ground plane, and in step 204 a buried oxide layer is formed in the substrate above the ground plane. In step 206, a relatively lightly doped channel is formed above the buried oxide layer. In step 208, a gate dielectric is deposited above the buried oxide layer, and in step 210 a highly doped polysilicon gate (116) is formed above the gate dielectric.

It is to be understood that embodiments may be directed to IGFETs (Insulated Gate Field Effect Transistors). That is, it is to be understood that use of the term MOSFET when describing any of the embodiments is not meant imply that the gate electrode is necessarily a metal. For example, the embodiments described above comprise a polysilicon gate 116 rather than a metal gate, and yet the description of such embodiments as a MOSFET type transistor is customary.

Figure 3:
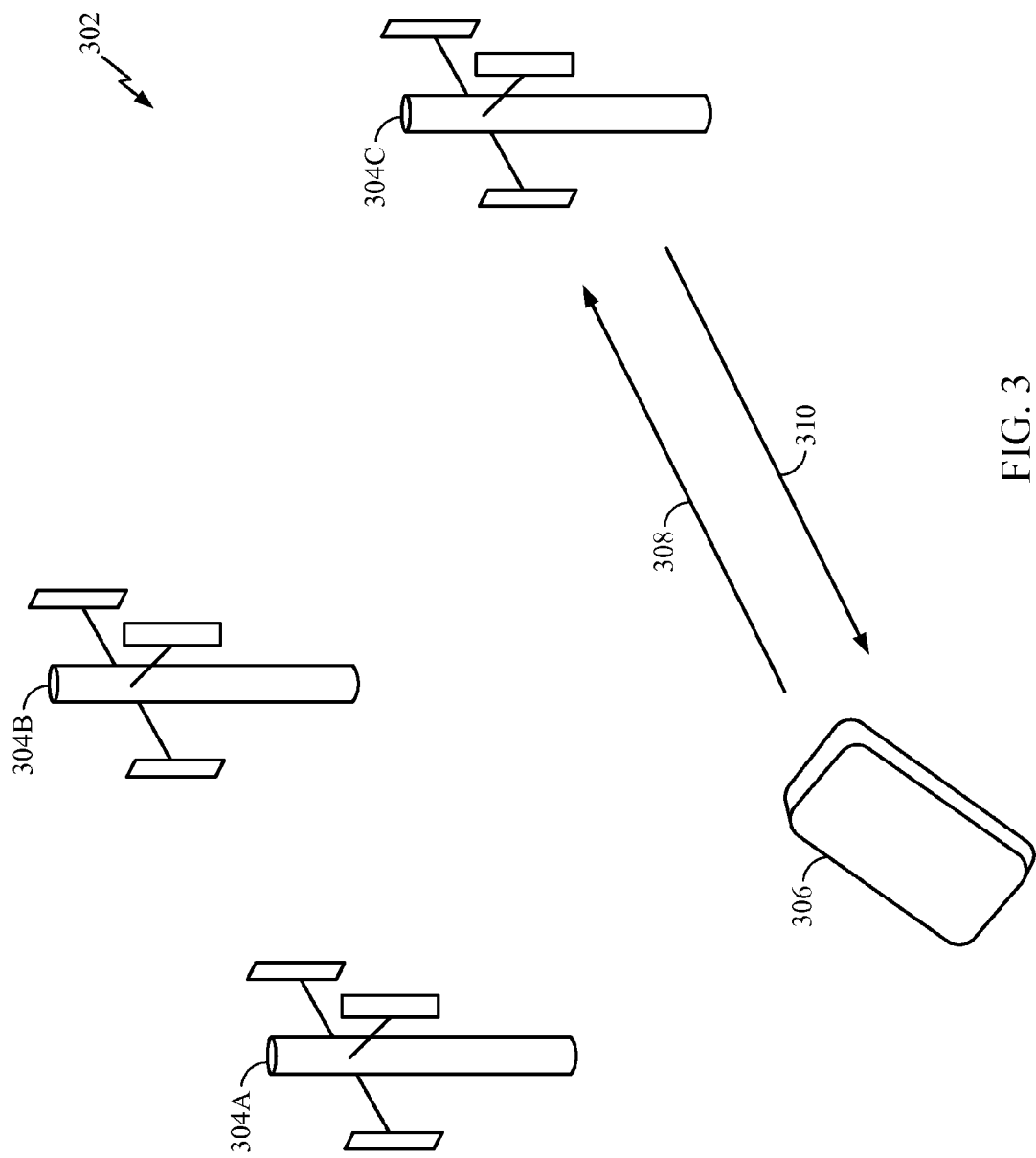
FIG. 3 illustrates a wireless communication system in which embodiments may find application.

FIG. 3 illustrates a wireless communication system in which embodiments may find application. FIG. 3 illustrates a wireless communication network 302 comprising base stations 304A, 304B, and 304C. FIG. 3 shows a communication device, labeled 306, which may be a mobile cellular communication device such as a so-called smart phone, a tablet, or some other kind of communication device suitable for a cellular phone network, such as a computer or computer system. The communication device 306 need not be mobile. In the particular example of FIG. 3, the communication device 306 is located within the cell associated with the base station 304C. Arrows 308 and 310 pictorially represent the uplink channel and the downlink channel, respectively, by which the communication device 306 communicates with the base station 304C.

Embodiments may be used in data processing systems associated with the communication device 306, or with the base station 304C, or both, for example. FIG. 3 illustrates only one application among many in which the embodiments described herein may be employed Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for adjusting the threshold voltage in an MOSFET with a SiON polysilicon gate stack on an FDSOI. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
a silicon substrate;
a doped ground plane formed in the silicon substrate;
a buried oxide layer formed in the silicon substrate;
a silicon channel formed on the buried oxide layer, the silicon channel doped p-type or n-type;
a first source/drain region formed in the silicon channel;
a second source/drain region formed in the silicon channel;
a dielectric layer formed on the silicon channel; and
a polysilicon gate formed on the dielectric layer, wherein
a work function of the polysilicon gate is not greater than a first work function level when the silicon channel is doped the p-type,
the work function of the polysilicon gate is not less than a second work function level when the silicon channel is doped the n-type,
the second work function level is higher than the first work function level, and
the work function of the polysilicon gate is not in between the first work function level and the second work function level.

2. The apparatus of claim 1, wherein the silicon channel has a thickness not greater than 10 nm and the buried oxide layer has a thickness not greater than 20 nm.

3. The apparatus of claim 1, wherein the doped ground plane of the silicon substrate has a doping concentration not less than $5 \times 10^{18}$ cm$^{-3}$.

4. The apparatus of claim 1, wherein the silicon channel has a doping concentration not greater than $5 \times 10^{17}$ cm$^{-3}$, and the dielectric layer formed on the silicon channel has a thickness in a range of 1.5 nm to 2.5 nm.

5. The apparatus of claim 1, wherein the dielectric layer formed on the silicon channel is selected from the group consisting of silicon dioxide, nitride silicon oxide, and silicon nitride.

6. The apparatus of claim 1, wherein the apparatus comprises a communication device selected from the group consisting of a cellular phone, a computer system, and a base station.

7. The apparatus of claim 1, wherein the first work function level is 4.2 eV and the second work function level is 5.0 eV.

8. An apparatus, comprising:
a silicon substrate;
a doped ground plane formed in the silicon substrate;
a buried oxide layer formed in the silicon substrate;
a silicon channel formed on the buried oxide layer, the silicon channel doped p-type or n-type;
a first source/drain region formed in the silicon channel;
a second source/drain region formed in the silicon channel;
a dielectric layer formed on the silicon channel; and
a polysilicon gate formed on the dielectric layer, wherein
a work function of the polysilicon gate is not greater than 4.2 eV when the silicon channel is doped the p-type,
the work function of the polysilicon gate is not less than 5.0 eV when the silicon channel is doped the n-type, and
the work function of the polysilicon gate is not in between 4.2 eV and 5.0 eV.

9. The apparatus of claim 8, wherein the silicon channel has a thickness not greater than 10 nm and the buried oxide layer has a thickness not greater than 20 nm.

10. The apparatus of claim 8, wherein the doped ground plane of the silicon substrate has a doping concentration not less than $5 \times 10^{18}$ cm$^{-3}$.

11. The apparatus of claim 8, wherein the silicon channel has a doping concentration not greater than $5 \times 10^{17}$ cm$^{-3}$, and the dielectric layer formed on the silicon channel has a thickness in a range of 1.5 nm to 2.5 nm.

12. The apparatus of claim 8, wherein the dielectric layer formed on the silicon channel is selected from the group consisting of silicon dioxide, nitride silicon oxide, and silicon nitride.

13. The apparatus of claim 8, wherein the apparatus comprises a communication device selected from the group consisting of a cellular phone, a computer system, and a base station.

* * * * *